(12) United States Patent
Mos et al.

(10) Patent No.: US 10,928,737 B2
(45) Date of Patent: Feb. 23, 2021

(54) METHOD FOR CHARACTERIZING DISTORTIONS IN A LITHOGRAPHIC PROCESS, LITHOGRAPHIC APPARATUS, LITHOGRAPHIC CELL AND COMPUTER PROGRAM

(71) Applicant: ASML NETHERLANDS B.V., Veldhoven (NL)

(72) Inventors: Everhardus Cornelis Mos, Best (NL); Jochem Sebastiaan Wildenberg, Aarle-Rixtel (NL); Roy Werkman, Eindhoven (NL); Erik Johannes Maria Wallerbos, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 196 days.

(21) Appl. No.: 16/079,404

(22) PCT Filed: Feb. 22, 2017

(86) PCT No.: PCT/EP2017/054017
§ 371 (c)(1),
(2) Date: Aug. 23, 2018

(87) PCT Pub. No.: WO2018/148759
PCT Pub. Date: Sep. 8, 2017

(65) Prior Publication Data
US 2019/0011842 A1  Jan. 10, 2019

(30) Foreign Application Priority Data

Mar. 4, 2016 (EP) .................................... 16158667

(51) Int. Cl.
*G03F 7/20* (2006.01)

(52) U.S. Cl.
CPC ...... *G03F 7/70625* (2013.01); *G03F 7/70525* (2013.01); *G03F 7/70633* (2013.01); *G03F 7/70641* (2013.01)

(58) Field of Classification Search
CPC ............. G03F 7/70625; G03F 7/70525; G03F 7/70633; G03F 7/70641
USPC ....................................................... 430/30
See application file for complete search history.

(56) References Cited

U.S. PATENT DOCUMENTS

| | | |
|---|---|---|
| 2005/0247873 A1 | 11/2005 | Hilton |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2014/0089870 A1 | 3/2014 | Mos et al. |

FOREIGN PATENT DOCUMENTS

| | | |
|---|---|---|
| WO | 02-23231 | 3/2002 |
| WO | 03-104929 | 12/2003 |
| WO | 2009-029851 | 3/2009 |
| WO | 2009-078708 | 6/2009 |
| WO | 2009-106279 | 9/2009 |
| WO | 2015-110191 | 7/2015 |

OTHER PUBLICATIONS

Taiwanese Office Action issued in corresponding Taiwanese Patent Application No. 106106953, dated Mar. 27, 2018.
International Search Report and Written Opinion issued in corresponding PCT Application No. PCT/EP2017/054017, dated Apr. 12, 2017.

*Primary Examiner* — Christopher G Young
(74) *Attorney, Agent, or Firm* — Pillsbury Winthrop Shaw Pittman LLP

(57) ABSTRACT

A method of characterizing distortions in a lithographic process, and associated apparatuses. The method includes obtaining measurement data corresponding to a plurality of measurement locations on a substrate, the measurement data comprising measurements performed on a plurality of substrates, and comprising one or more measurements performed on one or more of the substrates for each of the measurement locations. For each of the measurement locations, a first quality value representing a quality metric and a noise value representing a noise metric is determined from the measurements performed at that measurement location. A plurality of distortion parameters is determined, each distortion parameter configured to characterize a systematic distortion in the quality metric and a statistical significance of the distortion parameters from the first quality value and from the noise value is determined. Systematic distortion is parameterized from the distortion parameters determined to be statistically significant.

20 Claims, 3 Drawing Sheets

METHOD FOR CHARACTERIZING DISTORTIONS IN A LITHOGRAPHIC PROCESS, LITHOGRAPHIC APPARATUS, LITHOGRAPHIC CELL AND COMPUTER PROGRAM

CROSS-REFERENCE TO RELATED APPLICATIONS

This application is the U.S. national phase entry of PCT patent application no. PCT/EP2017/054017, which was filed on Feb. 22, 2017, which claims the benefit of priority of European patent application no. 16158667.2 which was filed on Mar. 4, 2016, and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay error (undesired misalignment of two layers).

Semiconductor processing equipment (e.g., lithography, etch, bake, polish and anneal) can introduce distortions in patterning performance (overlay, CD, Focus etc.) which may be characterized by a "fingerprint" describing the distortions in terms of a number of distortion parameters. Depending on the model used and the number of measurements made, the number of distortion parameters can vary, for example, between a few tens to over a thousand. The number of distortion parameters used to model the fingerprint is a balance between the time it takes to make sufficient measurements to sufficiently suppress noise and providing sufficient distortion parameters to properly describe the fingerprint. It would be desirable to provide a more efficient parameterization of a fingerprint for process corrections.

SUMMARY OF THE INVENTION

The invention in a first aspect provides a method of characterizing distortions in a lithographic process, said method comprising:
  obtaining measurement data corresponding to a plurality of measurement locations on a substrate, said measurement data comprising measurements performed on a plurality of substrates, and comprising one or more measurements performed on one or more of said substrates for each of said measurement locations;
  determining for each of said measurement locations a first quality value representing a quality metric and a noise value representing a noise metric from the measurements performed at that measurement location;

determining a plurality of distortion parameters, each distortion parameter being configured to characterize a systematic distortion in said quality metric;

determining a statistical significance of said distortion parameters from said first quality value and from said noise value; and parameterizing the systematic distortion from the distortion parameters determined to be statistically significant.

The invention further provides a lithographic apparatus or lithographic cell operable to perform the method of the first aspect.

The invention further provides a computer program comprising processor readable instructions which, when run on suitable processor controlled apparatus, cause the processor controlled apparatus to perform the method of the first aspect, and a computer program carrier comprising such a computer program. The processor controlled apparatus may comprise the aforementioned lithographic apparatus or lithographic cell.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
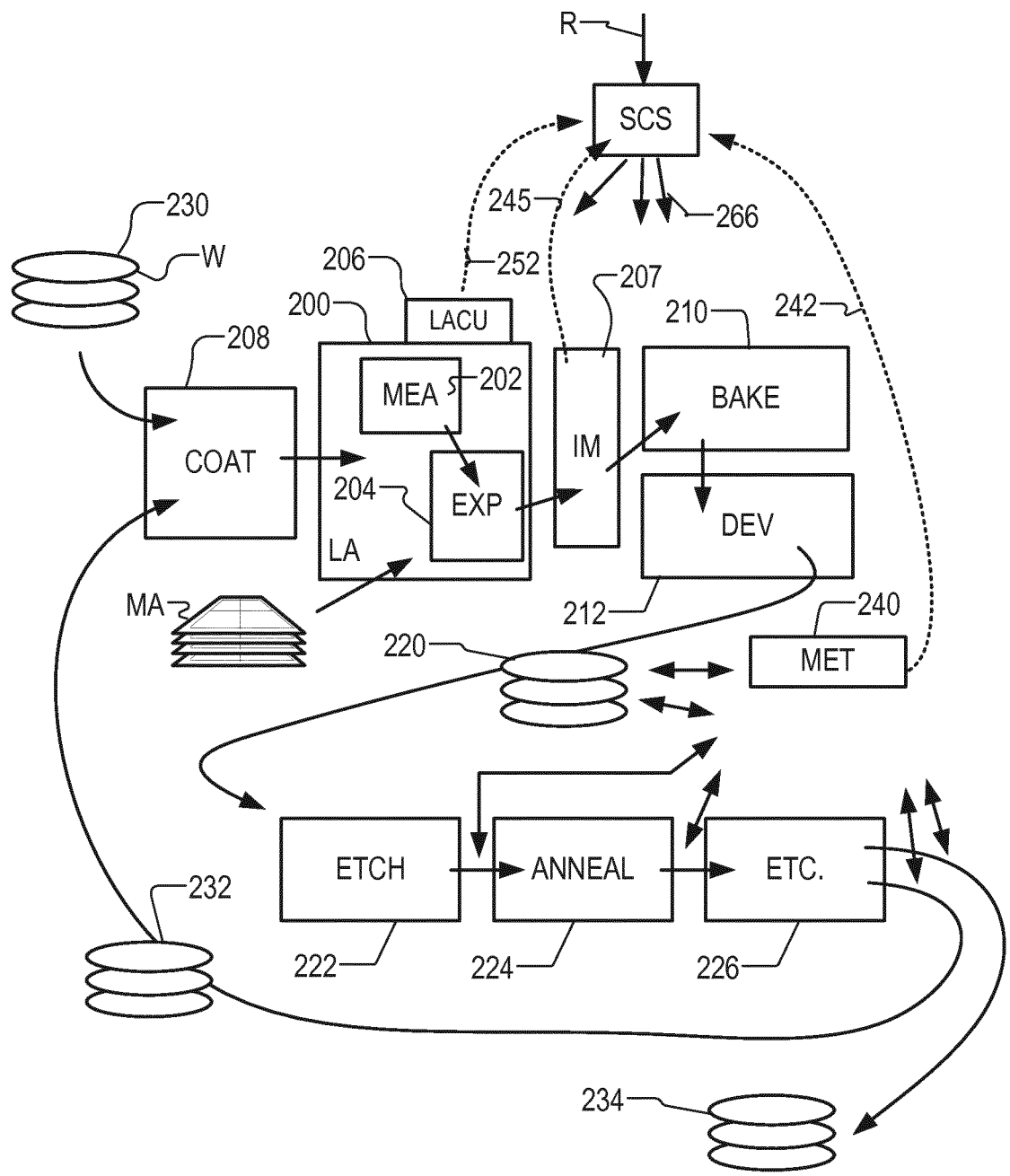
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located may also include one or more metrology systems. The metrology systems may include a stand-alone metrology apparatus MET 240 and/or an integrated metrology apparatus IM 207. The stand-alone metrology apparatus MET 240 receives some or all of the substrates W that have been processed in the litho cell for performing measurements offline. The integrated metrology apparatus IM 207 performs inline measurements and is integrated into the track to receive and measure some or all of the substrates W immediately after exposure. Metrology results are provided directly or indirectly to the supervisory control system (SCS) 238. If errors are detected, adjustments may be made to exposures of subsequent substrates, especially if the metrology can be done soon and fast enough that other substrates of the same batch are still to be exposed.

A common example of a metrology apparatus in a modern lithographic production facility is a scatterometer, for example an angle-resolved scatterometer or a spectroscopic scatterometer, and it may normally be applied to measure properties of the developed substrates at 220 prior to etching in the apparatus 222. Using stand-alone metrology apparatus 240 and/or integrated metrology apparatus 207, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

A metrology apparatus is shown in FIG. 2(a). The stand-alone metrology apparatus 240 and/or the integrated metrology apparatus 207 may comprise such a metrology apparatus, for example, or any other suitable metrology apparatus. A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
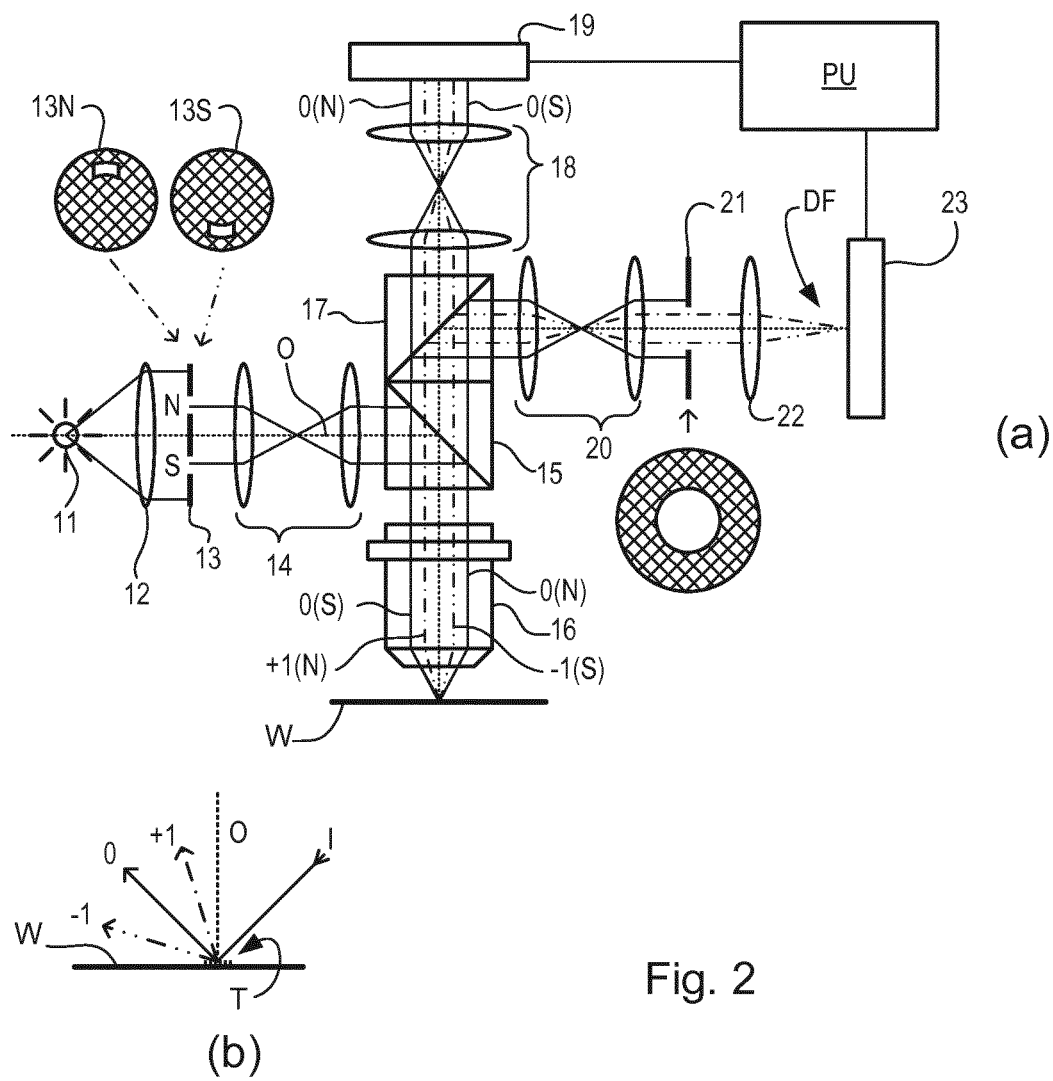
FIG. 2 comprises (a) a schematic diagram of a dark field scatterometer for use in measuring targets using a first pair of illumination apertures, (b) a detail of diffraction spectrum of a target grating for a given direction of illumination.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

Semiconductor processing tools can introduce variations that can lead to a process fingerprint, which characterizes the tool's imperfections. Such imperfections result in process distortions which cause (for example) overlay errors. A "fingerprint" is a systematic distortion, or deviation from ideal, in a metric, such as e.g., overlay, critical dimension, focus or dose. There may be a physical reason for the fingerprint, e.g., the geometry of a particular tool or apparatus. This deviation is systematic in the physical sense insofar as the variation will repeat over multiple instances (e.g., multiple fields, substrates, lots and/or times), although there can be a slow variation between different instances due to, for example, wear or other changes in the tool over time. The fingerprint metrics (as measured) vary as a function of another set of (known) distortion parameters and therefore can be characterized by these distortion parameters.

The most accurate process correction mechanism in lithographic processing commonly characterizes the fingerprints directly in terms of correctable distortion parameters of the lithographic process tool. One example is the corrections per exposure (CPE) technique which applies intra-field corrections per exposure. In this technique, correctable distortion parameters are measured on a processed wafer for each exposed field. These measured distortion parameters are than used to correct the fingerprint by applying appropriate corrections for each exposed field in subsequent lots, using all the correction capabilities (degrees of freedom) of the lithographic apparatus. A drawback of such methods of directly fitting correctable distortion parameters to fingerprint measurements is that it can be highly inefficient. The number of measurements required for correction is not a function of the fingerprint characteristics, but of the correction capabilities of the lithographic process tool. Until recently, the number of correctable distortion parameters was relatively few, so this was not a significant problem. Current tools have much greater correction capabilities (in the region of thousands of distortion parameters, e.g., between 1200 and 6000 distortion parameters depending on the apparatus), and therefore a fingerprint defined in terms of correctable distortion parameters has become unwieldy and requires a large number of measurements to obtain with sufficient noise suppression.

An alternative to CPE is a higher order process correction (HOPC) model in which only a subset of all fields and/or a subset of overlay targets per field are measured and a polynomial fitted to the measurements, the polynomial then being used to estimate overlay values for unmeasured fields. The HOPC model uses approximately 50 distortion parameters which are determined and updated each lot. Therefore, in contrast to CPE control, HOPC control per lot uses an insufficient number of distortion parameters to accurately capture the fingerprint.

More recently, it has become possible to choose a model with a more balanced number of distortion parameters, between the approximately 50 distortion parameters of HOPC and approximately 1200 distortion parameters of CPE, enabling run-to-run control each lot with more optimal fingerprint capture and noise suppression. Typically, this balance is such that the fingerprint capture aspect can be improved upon. Very high resolution fingerprints or fingerprints with a field-to-field discontinuity can be better captured, but only when there is sufficient data to average out noise.

It is therefore proposed to use a modelling and correction strategy where the resolution is dynamically adaptive depending on the amount of measurement data obtained and/or the quality of this measurement data. The model resolution will increase with the number of model distortion parameters that can be estimated with sufficient precision. In this way an optimal balance between fingerprint capture and noise suppression is maintained.

Figure 3:
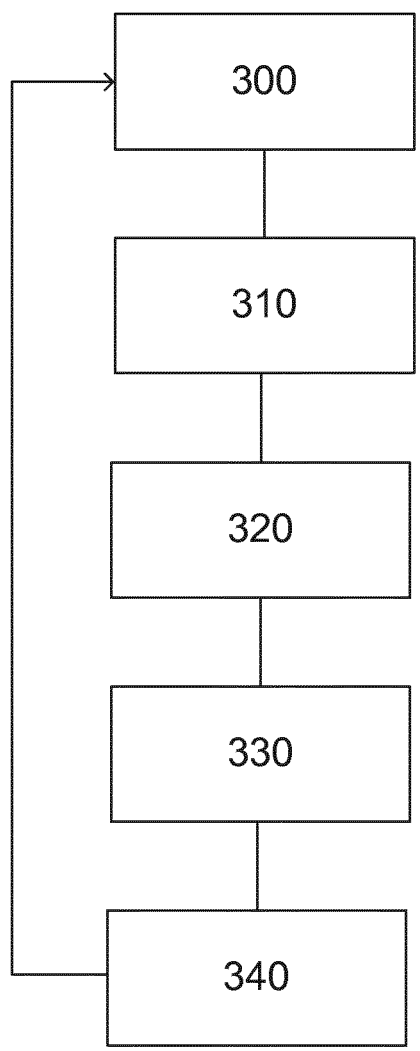
FIG. 3 is a flowchart describing a method for a modelling and correction strategy according to an embodiment of the invention.

FIG. 3 is a flowchart of the steps of a method for a modelling and correction strategy according to an exemplary embodiment. The steps are as follows, and are then described in greater detail thereafter:

300—Measure substrate;
310—Determine quality metric (e.g., overlay offset) per position;
320—Determine noise metric per position;
330—Determine which distortion parameters can be calculated with sufficient accuracy;
340—Determine corrections.

At step 300, measurements are made using a metrology apparatus. A full, dense substrate measurement required for CPE is too slow commercially to be performed on a per-wafer basis. Therefore, in an embodiment, it is proposed that only a subset of the total measurement locations are measured per substrate, with a different subset of measurement locations being measured on each substrate and/or each lot. In this way, over the course of a number of substrates or a number of lots, most or all of the measurement locations will be measured at least once. The measurement locations included in each subset may be sampled randomly (or pseudo-randomly), may follow set patterns, or the sampling may be based on a distortion parameter value and/or one or models (such as a fingerprint model). Such a sampling method will take multiple substrates, and possibly multiple lots, to obtain one or more fully measured substrates (a "fully measured substrate" in this context meaning measurement data comprising at least one measurement for each measurement location, the measurement data comprising measurements performed on a number of different substrates in actuality). Furthermore, different measurement locations will not necessarily be measured an equal number of times.

At step 310, a first quality value representing a quality metric is determined per measurement location. This first quality value may be calculated as a moving average (e.g., mean) as more measurements at each measurement location are made. The quality metric in the described embodiment is overlay offset, although it may comprise another metric such as critical dimension, focus or dose, for example.

At step 320, a noise value representing the random variation in the measurements (or other noise metric) per measurement location is determined. This noise value may comprise the standard deviation of the measurements. This random variation may be calculated as a moving average as more measurements at each measurement location are made.

At step 330, using the results of steps 310 and 320, it is determined which distortion parameters of one or more (e.g., higher resolution) estimation models can be determined with a sufficient statistical significance. This may be achieved by determining from the results of steps 310 and 320, a substrate map indicating the average (e.g., mean) overlay offset and a confidence interval. In general, (for a given confidence level) the more times that a measurement location is actually measured and/or the less random variation (smaller standard deviation) there is in the measured data, the smaller the confidence interval will be for that measurement location. More specifically, the confidence interval defines a range of observed overlay values which is likely to comprise the actual overlay value for that measurement location. The level of confidence that the actual overlay value is within the confidence interval is the confidence level, which can in theory be set at any value. Any appropriate confidence level may be chosen, for example any value greater than 85%, greater than 90%, greater than 95% or greater than 99%. In an embodiment, the confidence level may be 90%, or at the 2-sigma (95%) or at 3-sigma level (99.7%). The significance level is a complement of the confidence level, i.e., a confidence level of 90% yields a significance level of 10%.

In an embodiment, for each measurement location, the difference of the overlay offset values estimated according to one (or more) (e.g., lower resolution) models (second quality values) and the overlay offset values as estimated from actual measurements at that measurement location (first quality values) is calculated. The difference may be thought of, for example, as the difference between overlay offset values from a lower resolution model and from a CPE model. It is then determined whether this difference (if any) is statistically significant. This determination may be made by determining whether this difference is outside of the confidence interval as determined for that location. If the difference is outside of the confidence interval, then it may be considered to be statistically significant, otherwise not. As the number of measurement locations increases for which there is calculated a statistically significant difference, the resolution of the model used to describe the fingerprint in an iteration can also be increased, while ensuring noise is sufficiently suppressed. By way of specific example, the lower resolution model may be a higher-order estimation model with between 40 and 100 distortion parameters (e.g., between 50 and 80 distortion parameters) and the higher resolution model may be a CPE estimation model with more than 500 distortion parameters or more than 1000 distortion parameters (e.g., in the region of 1200 distortion parameters), or more than 3000 distortion parameters or more than 5000 distortion parameters.

To provide a specific example for illustration, an overlay offset value may be estimated using a low resolution model at a measurement location. The overlay offset may also have been actually measured twice at the measurement location using a metrology tool. As with any measurement, the measured values will be subject to noise (random variation) and therefore may differ. The mean of the measured values can be calculated, as can a measure of the random variation (e.g., standard deviation) and confidence interval. The difference between the overlay offset value estimated using the low resolution model and the overlay offset value estimated using overlay offset values directly obtained from actual measurements at that location (e.g. using a high resolution model or CPE model) is calculated. If this difference lies outside of the confidence interval, then it is considered statistically significant and the CPE model is considered to provide a statistically significantly improved estimate over the low resolution model and as such the corresponding high resolution distortion parameters can be used to describe the fingerprint for this location. If the difference lies within the confidence interval, then it may be attributed to noise and the lower resolution distortion parameters used (the lower resolution distortion parameters are also used when there is no difference). As more measurements are made at that location, the confidence interval will become smaller and therefore it becomes more likely that the determined difference in offset values between the models is determined to be statistically significant, meaning that more high resolution distortion parameters can be used to describe the fingerprint.

The fingerprint may be described according to one of a number of predetermined models, with the model chosen which best fits the statistically significant higher resolution distortion parameters and the remaining lower resolution distortion parameters. Alternatively, the modelled fingerprint may be varied on a per-distortion parameter basis, with each higher resolution distortion parameter that is determined to be statistically significant included in the modelled fingerprint. As a further alternative, a combination of these two previous alternatives can be used, where the best fitting model of a number of predetermined models is selected and then further varied on a per-parameter basis to improve the fit further. In this way, the resultant fingerprint will be described with more distortion parameters as each distortion parameter is determined with sufficient statistical significance.

At step 340, the resultant fingerprint is used to calculate corrections using some, most or all degrees of freedom of the lithographic apparatus corresponding to the model distortion parameters describing the fingerprint for that iteration.

This method may then be repeated such that the modelled fingerprint and consequently the calculated corrections are updated iteratively. Each iteration may be performed per number of measurements, per substrate measured, per number of substrates measured, per lot, or per fully measured substrate for example.

The sampling at step 300 is described as optionally being based on a distortion parameter value. In an embodiment, the distortion parameter value may be the difference between an overlay offset and a statistical precision limit. In this way, the precision at a location where an overlay offset value is close to a statistical precision limit can be adaptively optimized using the metrology data. For example, where the difference between the overlay offset value determined using a lower resolution model and the overly offset value determined directly from measurements for that location is within the confidence interval for this location, but close to the confidence limit, then this location may be chosen for a further measurement on the next substrate (or so). Close to the confidence limit may be within a percentage value of the confidence limit. Or else, it may be determined that measurements for each iteration comprise measurements of one or more locations for which this difference is closest to the corresponding confidence limit. In this way, the overlay offset value from the measured data close to the confidence limit but within the confidence interval may be taken outside of the confidence interval and therefore be considered statistically significant, enabling an increase in the fingerprint resolution.

In the above description, the quality metric comprises overlay offset. However, this is only one example of a quality metric which benefits from corrections determined using the concepts described herein. Other quality metrics which can be used in place of overly offset in the methods described above include critical dimension, focus or dose.

The concepts proposed herein provide an adaptive resolution control, based on statistical significance of overlay offsets in measured data and dynamic sampling to cover the full substrate for control. An additional benefit is that the user gets insight in measured offsets and variation on full substrate coverage.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The embodiments may further be described using the following clauses:

1. A method of characterizing a distortion in a lithographic process, said method comprising:

obtaining measurement data corresponding to a plurality of measurement locations on a substrate, said measurement data comprising measurements performed on a plurality of substrates, and comprising one or more measurements performed on one or more of said substrates for each of said measurement locations;

determining for each of said measurement locations a first quality value representing a quality metric and a noise value representing a noise metric from the measurements performed at that measurement location;

determining a plurality of distortion parameters, each distortion parameter being configured to characterize a systematic distortion in said quality metric;

determining a statistical significance of said distortion parameters from said first quality value and from said noise value; and parameterizing the systematic distortion from the distortion parameters determined to be statistically significant.

2. A method according to clause 1, further comprising a step of determining corrections for a lithographic process based on a parameterization resultant from the parameterizing step.

3. A method according to clause 2, further comprising a step of performing a lithographic process using said corrections.

4. A method according to any preceding clause, wherein said measurement data comprises measurements performed on a subset of a preselected set of measurement locations on each substrate, the subset being varied for different substrates.

5. A method according to clause 4, wherein the subset for each substrate is selected according to an order of the measurement locations.

6. A method according to clause 4, wherein the subset for each substrate is selected randomly or pseudo-randomly.

7. A method according to clause 4, 5 or 6, wherein said subset is selected to optimize the number of distortion parameters which can be determined with statistical significance.

8. A method according to any preceding clause, wherein said quality metric is an overlay metric being a measure of unintentional positional offset between different layers on the substrate.

9. A method according to any of clauses 1 to 7, wherein said quality metric is any one selected from a list comprising: critical dimension, focus or dose.

10. A method according to any preceding clause, wherein said first quality value comprises an average of actual measurements of the quality metric at each location.

11. A method according to any preceding clause, wherein said noise value comprises a random variation in different measurements performed at each measurement location.

12. A method according to clause 11, wherein said noise value comprises an average of the random variation in actual measurements of the first quality value at each location.

13. A method according to any preceding clause, wherein the step of parameterizing comprises selecting a distortion parameter model from a number of distortion parameter models.

14. A method according to any of clauses 1 to 12, wherein the step of parameterizing comprises parameterizing determined on a single distortion parameter basis.

15. A method according to any preceding clause, wherein the step of parameterizing comprises parameterizing based on a number of distortion parameters varying between a minimum number less than 100 and a maximum number greater than 1000.

16. A method according to any preceding clause, wherein said distortion parameters are parameters of one or more models.

17. A method according to any preceding clause, comprising, for each of said measurement locations:

determining a second quality value representing the quality metric using a lower resolution model;

determining a difference between the first quality value and the second quality value; and determining whether the difference is statistically significant.

18. A method according to clause 17, wherein the step of parameterizing further comprises, for each measurement location, including a greater number of distortion parameters for the parameterizing the systematic distortion when said difference is determined to be statistically significant compared to when the difference is determined to be not statistically significant or when there is no difference.

19. A method according to clause 18, wherein:

the systematic distortion in said quality metric is characterized by the distortion parameters defined by a higher resolution model when said difference is statistically significant, and by a lower resolution model when said difference is not statistically significant or when there is no difference.

20. A method according to clause 19, wherein said lower resolution model comprises a polynomial for fitting the measurements.

21. A method according t any of clauses 17 to 20, wherein said step of determining whether the difference is statistically significant comprises:

determining a confidence interval for each of first quality values using said noise values; and determining said difference is statistically significant when said difference is outside of said confidence interval.

22. A method according to any preceding clause, comprising performing said method iteratively with said measurement data comprising a greater number of measurements at each iteration.

23. A method according to clause 22, comprising, for one or more distortion parameters determined not to be statistically significant by a small margin, measuring a measurement location corresponding to these distortion parameters during a next iteration.

24. A method according to clause 23, wherein said small margin is defined as being within 30% of a corresponding confidence interval.

25. A method according to clause 23, wherein said small margin is defined as being within 10% of a corresponding confidence interval.

26. A method according to any of clauses 22 to 25, wherein said plurality of substrates are divided into lots and each iteration is performed for a different lot of substrates.

27. A method according to any preceding clause, comprising performing said measurements at a plurality of measurement locations on a plurality of substrates to obtain said measurement data.

28. A computer program comprising processor readable instructions which, when run on suitable processor controlled apparatus, cause the processor controlled apparatus to perform the method of any preceding clause.

29. A computer program carrier comprising the computer program of clause 28.

30. A lithographic apparatus being operable to perform the method of any of clauses 1 to 26.

31. A lithographic apparatus according to clause 30, comprising:
an illumination optical system arranged to illuminate a pattern;
a projection optical system arranged to project an image of the pattern onto a substrate.

32. A lithographic cell comprising the lithographic apparatus of clause 30 or 31 and a metrology apparatus, said lithographic cell being operable to perform the method of clause 27.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of characterizing a distortion in a lithographic process, the method comprising:
obtaining measurement data corresponding to a plurality of measurement locations on a substrate, the measurement data comprising measurements performed on a plurality of substrates, and comprising one or more measurements performed on one or more of the substrates for each of the measurement locations;
determining, for each of the measurement locations, a first quality value representing a quality metric and a noise value representing a noise metric from the one or more measurements performed at that respective measurement location;
determining a plurality of distortion parameters, each distortion parameter configured to characterize a systematic distortion in the quality metric;
determining a statistical significance of the distortion parameters from the first quality value and from the noise value; and
parameterizing the systematic distortion from the distortion parameters determined to be statistically significant.

2. The method as claimed in claim 1, further comprising determining corrections for a lithographic process based on a parameterization resultant from the parameterizing.

3. The method as claimed in claim 2, further comprising performing a lithographic process using the corrections.

4. The method as claimed in claim 1, wherein the measurement data comprises measurements performed on a subset of a preselected set of measurement locations on each substrate, the subset being varied for different substrates.

5. The method as claimed in claim 4, wherein the subset for each substrate is selected according to an order of the measurement locations, or wherein the subset for each substrate is selected randomly or pseudo-randomly, or wherein the subset is selected to optimize the number of distortion parameters which can be determined with statistical significance.

6. The method as claimed in claim 1, wherein the quality metric is an overlay metric, the overlay metric being a measure of unintentional positional offset between different layers on the substrate.

7. The method as claimed in claim 1, wherein the quality metric is any one selected from: critical dimension, focus or dose.

8. The method as claimed in claim 1, wherein the first quality value comprises an average of actual measurements of the quality metric at each location.

9. The method as claimed in claim 1, wherein the parameterizing comprises selecting a distortion parameter model from a number of distortion parameter models, or comprises parameterizing determined on a single distortion parameter basis, or comprises parameterizing based on a number of distortion parameters varying between a minimum number less than 100 and a maximum number greater than 1000.

10. The method as claimed in claim 1, wherein the distortion parameters are parameters of one or more models.

11. The method as claimed in claim 1, further comprising, for each of the measurement locations:
determining a second quality value representing the quality metric using a lower resolution model;
determining a difference between the first quality value and the second quality value; and
determining whether the difference is statistically significant.

12. The method as claimed in claim 11, wherein the determining whether the difference is statistically significant comprises:
determining a confidence interval for each of first quality values using the noise values; and
determining the difference is statistically significant when the difference is outside of the confidence interval.

13. The method as claimed in claim 1, further comprising performing the method iteratively with the measurement data comprising a greater number of measurements at each iteration.

14. The method as claimed in claim 13, further comprising, for one or more distortion parameters determined not to be statistically significant by a certain margin, measuring a measurement location corresponding to these one or more distortion parameters during a next iteration.

15. A non-transitory computer program product comprising processor readable instructions which, when run on a suitable processor controlled apparatus, cause the processor controlled apparatus to at least:
obtain measurement data corresponding to a plurality of measurement locations on a substrate, the measurement data comprising measurements performed on a plurality of substrates, and comprising one or more measurements performed on one or more of the substrates for each of the measurement locations;

determine, for each of the measurement locations, a first quality value representing a quality metric and a noise value representing a noise metric from the one or more measurements performed at that respective measurement location;

determine a plurality of distortion parameters, each distortion parameter configured to characterize a systematic distortion in the quality metric;

determine a statistical significance of the distortion parameters from the first quality value and from the noise value; and parameterize the systematic distortion from the distortion parameters determined to be statistically significant.

16. The computer program product of claim 15, wherein the instructions are further configured to cause the processor controlled apparatus to determine corrections for a lithographic process based on a parameterization resultant from the parameterizing the systematic distortion.

17. The computer program product of claim 15, wherein the measurement data comprises measurements performed on a subset of a preselected set of measurement locations on each substrate, the subset being varied for different substrates.

18. The computer program product of claim 15, wherein the quality metric is any one selected from: overlay, critical dimension, focus or dose.

19. The computer program product of claim 15, wherein the first quality value comprises an average of actual measurements of the quality metric at each location.

20. The computer program product of claim 15, wherein the parameterization of the systematic distortion comprises selection of a distortion parameter model from a number of distortion parameter models, or comprises parameterization determined on a single distortion parameter basis, or comprises parameterization based on a number of distortion parameters varying between a minimum number less than 100 and a maximum number greater than 1000.

* * * * *